US006492704B1

(12) United States Patent
Coroy

(10) Patent No.: US 6,492,704 B1
(45) Date of Patent: Dec. 10, 2002

(54) PHOTODIODES WITH PHOTOCONDUCTIVE GAIN ENHANCEMENT

(76) Inventor: Trenton G. Coroy, 12175 Abbey Ct., Rancho Cucamonga, CA (US) 91739

( * ) Notice: Subject to any disclaimer, the term of this patent is extended or adjusted under 35 U.S.C. 154(b) by 0 days.

(21) Appl. No.: 09/958,819
(22) PCT Filed: Apr. 14, 2000
(86) PCT No.: PCT/CA00/00396
§ 371 (c)(1),
(2), (4) Date: Oct. 15, 2001
(87) PCT Pub. No.: WO00/63976
PCT Pub. Date: Oct. 26, 2000

Related U.S. Application Data
(60) Provisional application No. 60/129,365, filed on Apr. 15, 1999.

(51) Int. Cl.[7] .................. H01L 31/06; H01L 31/075; H01L 31/105; H01L 31/117
(52) U.S. Cl. .................. 257/461; 257/458; 257/463; 257/656
(58) Field of Search .................. 257/458, 461, 257/463, 656

(56) References Cited

U.S. PATENT DOCUMENTS

| 4,701,773 A | * 10/1987 | Kaneda et al. |
| 4,816,890 A | * 3/1989 | Ouchi et al. |
| 4,857,982 A | * 8/1989 | Forrest |
| 6,081,020 A | * 6/2000 | Frahm et al. |

OTHER PUBLICATIONS

Fukato, W., "Photoconductivity Gain Over 10 At Large Electric Field In Wide Gap", Journal of Non–Crystalline Solids, vol. 227–230, May 1998, pp. 220–224.

Bradely P.J. et al., "Carrier Induced Transient Electric Fields in a P–I–N INP–INGAAS Multiple–Quantum–Well Modulator", IEEE Journal of Quantum Electronics, US, IEEE Inc., New York, vol. 32, No. 1, Jan. 1, 1996, pp. 43–52.

Missous, M., "Fundamental Issues of Device–Relevant Low Temperature GaAs and Relatd Materials Properties", Materials Science and Engineering B, CH, Elsevier Sequoia, Lausanne, vol. 44, No. 1–3, Feb. 1, 1997, pp. 304–310.

Sugawara, M., "Optical Characteristics of Excitons in In1–xGaxAsyP1–y/InP Quantum Wells", Physical Review B, US, The American Physical Society, vol. 44, No. 4, Jul. 15, 1991, pp. 1782–1791.

(List continued on next page.)

Primary Examiner—Ngân V. Ngô
(74) Attorney, Agent, or Firm—Lynn C. Schumacher; Hill & Schumacher

(57) ABSTRACT

The present invention provides photodiodes exhibiting photoconductive gain. It is shown that photodiodes may exhibit photoconductive gain under certain conditions, and traditional photoconductive gain theory has been extended to describe these cases. Particularly, there is introduced the basic principles of photoconductive gain in p-i-n diodes, and there is described several approaches to designing photodiodes with photoconductive gain. In one approach, photogenerated carrier delay is used to obtain photoconductive gain in a photodiode. Delay structures inserted into the intrinsic region preferentially impede the flow of one of the carriers relative to the other to obtain the gain. Another method of obtaining photoconductive gain in a photodiode is to increase the rate at which electron-hole pairs are generated in the p-region or n-region, so as to decrease the times $\tau_p$ or $\tau_n$. One way of decreasing $\tau_p$ or $\tau_n$ is to include a region of "ultra-fast" high B-coefficient material in or near either the p-region or n-region, which has a much lower value of $\tau_p$ or $\tau_n$ for a given doping level.

24 Claims, 3 Drawing Sheets

OTHER PUBLICATIONS

Temkin, H., InGaAsP/InP Quantum Well Modulators Grown by Gas Source Molecular Beam Epitaxy, Appl. Phys. Lett, US, American Institute of Physics, vol. 50, No. 25, Jun. 22, 1987, pp. 1776–1778.

Gill, W.D., "Photovoltaic Properties of Cu2S–CdS Heterojunctions", Journal of Applied Physics, vol. 41, No. 9, Aug. 1970, pp. 3731–3738.

Landis, G.A. et al, "Photoluminescence Lifetime Measurements in INP Wafers", Proceedings of the International Conference on Indium Phosphide and Related Materials, US, New York, IEEE, vol. Conf. 3, 1991, pp. 636–639.

Mitchell, D.B. et al., "He–Plasma Assisted Epitaxy for Highly Resistive, Optically Fast INP–Based Materials", Applied Physics Letters, US, American Institute of Physics, New York, vol. 69, No. 4, Jul. 22, 1996, pp. 509–511.

Mei, X.B. et al., "Strain–Compensated INASP/GAINP Multiple Quantum Wells for 1.3 Mum Waveguide Modulators", Applied Physics Letters, US, American Institute of Physics, New York, vol. 68, No. 1, Jan. 1, 1996, pp. 90–92.

Mei, X.B. et al., "Improved Electroabsorption Properties in 1.3 Mum MQW Waveguide Modulators by a Modified Doping Profile", Journal of Crystal Growth, NL, North–Holland Publishing Co., Amsterdam, vol. 175–176, May 1, 1997, pp. 994–998.

Agrawal, N. et al., "Ultrafast Electron Dynamics in INGAALAS/INP Graded–GAP Electron Transfer Optical Modulator Structures", Proceedings of the International Conference on Indium Phosphide and Related Materials, US, New York, IEEE, vol. Conf. 6, 1994, pp. 83–86.

* cited by examiner

PHOTODIODES WITH PHOTOCONDUCTIVE GAIN ENHANCEMENT

This application claims the benefit of provisional application No. 60/129,365, filed Apr. 15, 1999.

FIELD OF THE INVENTION

The present invention relates to photodiode devices exhibiting photoconductive gain enhancement.

BACKGROUND OF THE INVENTION

Photodiodes are one of the most basic building blocks of photonic systems, and the physics of p-i-n diodes is an area considered by many to be well understood. Conventional treatment of a pi-n diode assumes a maximum photoconductive gain of unity, g=1. This assumption has proven so reliable for bulk photodiodes that it has become accepted as a fundamental property of photodiodes, although the mechanisms preventing greater than unity photoconductive gains have not been well described in the literature. More recently, p-i-n photodiodes have been designed with heterojunction structures (such as multiple quantum well structures) in the intrinsic region, and to date these devices have been modeled using the same assumption of unity photoconductive gain (for example see M. K. Chin and W. S. C. Chang, "InGaAs/InAlAs Quantum-Well Electroabsorption Waveguide Modulators With Large-Core Waveguide Structure: Design And Characterization", Appl. Opt., 34:1544–1553, 1995; A. M. Fox, D. A. B. Miller, G. Livescu, J. E. Cunningham, and W. Y. Jan, "Quantum Well Carrier Sweep Out: Relation To Electroabsorption And Exciton Saturation", IEEE J. Quantum Electron., 27:2281–2295, 1991).

The ability to produce photodiodes with controlled photoconductive gain would be of great benefit for use in photodetector devices and the like. For example, any application requiring detection of very low light intensity levels would benefit significantly with the use of photodiodes having photoconductive gain. Therefore, it would be advantageous to provide semiconductor photodiodes exhibiting photoconductive gain.

SUMMARY OF THE INVENTION

It is an object of the present invention to provide photodiode devices exhibiting photoconductive gain.

The inventor has demonstrated that photodiodes may exhibit photoconductive gain under certain conditions, and that these gains may be described to first order by a simple extension of photoconductive gain theory. In the present application there is introduced the basic principles of photoconductive gain in p-i-n diodes, and there is described several approaches to designing photodiodes with photoconductive gain.

In one aspect of the invention there is provided a photodiode with photoconductive gain, comprising:

a semiconductor including at least one p-type region, at least one n-type region, and electrical contacts attached to said n-type region and to said p-type region, whereby illuminating said semiconductor generates electron-hole pairs in at least one depletion region formed at a p-n junction; and means for enhancing an electron-hole pair generation rate in at least a portion of said semiconductor outside said at least one depletion region, In this aspect of the invention the means for enhancing an electron-hole pair generation rate may comprise the at least a portion of the semiconductor including an effective semiconductor material having a minority carrier lifetime shorter than or on an order of a difference between the average times for an electron and a hole photogenerated within a specific depletion region to escape the specific depletion region.

In this aspect of the invention the means for enhancing an electron-hole pair generation rate in at least a portion of the semiconductor outside the at least one depletion region may be by optical stimulation of the at least a portion of the semiconductor.

In another aspect of the invention there is provided a photodiode with photoconductive gain, comprising:

a semiconductor including at least one p-type region, at least one n-type region, at least one intrinsic region, and electrical contacts attached to said n-type region and to said p-type region, whereby illuminating said semiconductor generates electron-hole pairs in at least one depletion region formed at a p-n junction and/or at an intrinsic region; and means for enhancing an electron-hole pair generation rate in at least a portion of said semiconductor outside said at least one depletion region.

BRIEF DESCRIPTION OF THE DRAWINGS

The method of generating photoconductive gain in photodiodes forming the subject invention will now be described, by example only, reference being had to the accompanying drawings, in which.

DETAILED DESCRIPTION OF THE INVENTION

THEORY

The inventor has unexpectedly discovered that photoconductive gain greater than unity can be achieved in for example p-i-n photodiodes, and that these gains may be described to first order by a simple extension of photoconductive gain theory. This theory provides insight into the mechanisms that prevent photoconductive gain in typical photodiodes, and at the same time provides a basis for the design of photodiodes with greater than unity photoconductive gains.

Consider as an example a generic p-i-n photodiode where electron velocities are greater than hole velocities in the depletion region, and where the electrical connections at both the anode and cathode exhibit ohmic behavior. In order to simplify this initial description of photoconductive gain mechanisms in p-i-n photodiodes, assume that the photogenerated electron and hole both survive long enough to be collected at the edges of the intrinsic region. On average, when an electron-hole pair (EHP) is photogenerated in the depletion region, the electron will be collected at the n-region (cathode) before the hole reaches the p-region (anode), leaving a net positive charge in the intrinsic region of the photodiode. The resulting majority carrier flow through the n-region, external circuit and p-region will introduce an excess electron in the valence band of the p-region, where it effectively decreases the hole population by one. This depleted hole may now be replaced by one of two mechanisms: either the photogenerated hole will be collected at the p-region; or EHP generation will restore the equilibrium hole population and provide an excess minority electron, which may then be injected into the depletion region.

Figure 1A:
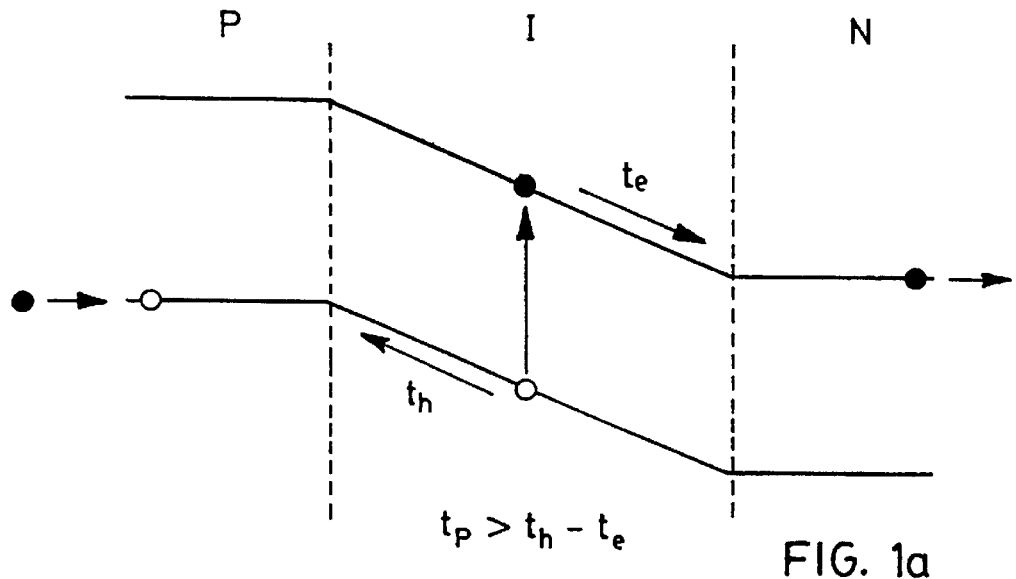
FIG. 1a is an energy band diagram for a p-i-n photodiode illustrating an example of carrier collection for a photogenerated electron-hole pair where photoconductive gain does not occur.

These two mechanisms are illustrated in p-i-n photodiode energy band diagrams FIGS. 1a) and 1b) respectively, for a single EHP generated in the intrinsic region, where the generated electron escapes the intrinsic region before the generated hole does. Let us define $t_e$ and $t_h$ to be the escape times for the electron and hole for this specific EHP, and $t_p$ to be the time it takes for this specific excess electron in the valence band of the p-region to be excited into the conduction band. For $t_p > t_h - t_e$, the photogenerated hole is collected at the p-region before the p-region has time to supply an excess electron to the intrinsic region, thus preventing photoconductive gain.

In the second mechanism, EHP generation will restore the equilibrium hole population and provide an excess minority electron, which will then be injected into the depletion region. Referring to the energy band diagram of FIG. 1b, if $t_p < t_h - t_e$, the excess electron will be injected into the intrinsic region before the photogenerated hole reaches the p-region, thus providing the mechanism for photoconductive gain.

Figure 1B:
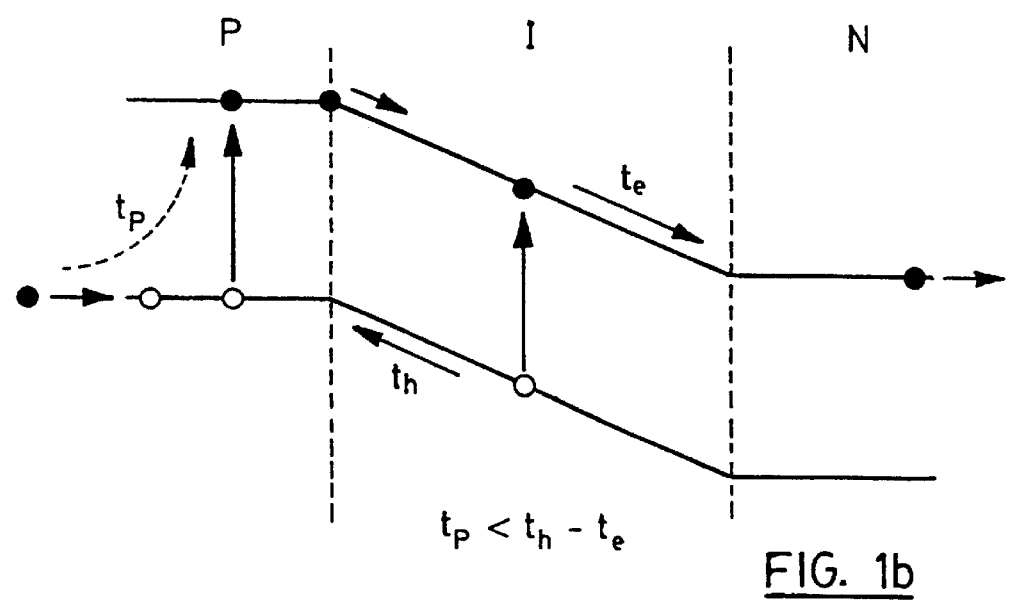
FIG. 1b is an energy band diagram of a p-i-n photodiode illustrating an example of carrier collection for a photogenerated electron-hole pair in the case where photoconductive gain does occur.

Now let us consider the case where there are not one, but many EHPs generated in the intrinsic region, with a distribution of times $t_p$ and $t_h - t_e$. If the photogenerated holes remain in the depletion region long enough, the depleted holes in the p-region will be replaced by EHP generation, as illustrated in FIG. 1b. Deviations in carrier populations from their equilibrium values decay exponentially in time, with a characteristic time constant called the recombination lifetime, or minority carrier lifetime, $\tau$. Thus after an average time delay $\tau_p$, the excess electron in the valence band of the p-region will be excited into the conduction band, re-establishing the equilibrium hole population, and providing an excess minority electron in the p-region to be swept into the depletion region. However, if the photogenerated hole reaches the p-region first, as illustrated in FIG. 1a, this process will be prevented, and no excess minority electron will be produced. The condition for photoconductive gain in a p-i-n photodiode may be written as $$\tau_p \lesssim t_{have} - t_{eave}, \text{ for } t_{have} > t_{eave}, \qquad (1)$$

and $$\tau_n \lesssim t_{eave} - t_{have}, \text{ for } t_{have} < t_{eave}, \qquad (2)$$

where $\tau_p$ and $\tau_n$ are the minority carrier lifetimes in the p-region and n-region of the photodiode, and $t_{eave}$ and $t_{have}$ are the average times the photogenerated electron and hole spend the intrinsic region. Note that these are qualitative conditions (the symbol "$\lesssim$" as used herein means less than or on the order of) because $\tau_p$, $\tau_n$, and $|t_{eave} - t_{have}|$ are only average values, and photoconductive gain can be expected to occur even in cases where $\tau_p$ and $\tau_n$ are much greater that $|t_{eave} - t_{have}|$, although with a low enough probability that the effect becomes negligible.

Figure 2:
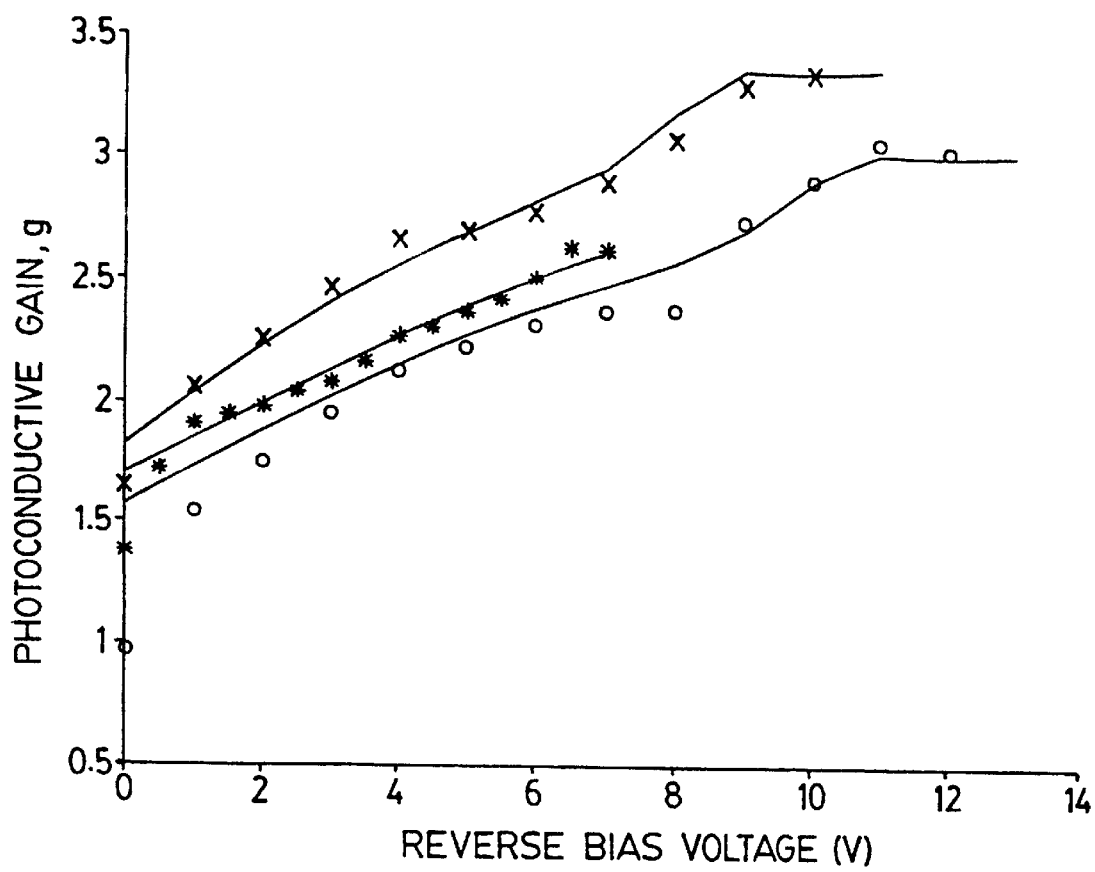
FIG. 2 shows experimental (symbols) and theoretical (lines) photoconductive gains for three InGaAs/InP p-i-n photodiodes as a function of applied reverse bias voltage.

In practice, minority carrier lifetimes vary inversely with majority carrier concentrations, such that in general, $$\tau = 1/(BN), \qquad (3)$$

where N is the majority carrier concentration of the region of interest. (It has been assumed here that minority carrier concentrations are negligible compared to majority carrier concentrations). B is a characteristic coefficient for a given material, and is related to the thermal EHP generation rate $g_i = B n_i^2$, where $n_i$ is the intrinsic carrier concentration of the material. From (3) one can see that higher doping in the p region and/or n region will result in decreased values of $\tau_p$, and therefore greater possibilities for photoconductive gain. The times $t_{eave}$ and $t_{have}$ will depend on the transit times for electrons and holes to travel through the intrinsic region of the diode and on the average position in the intrinsic region that photogenerated EHPs (that are collected by the photodiode) are generated. To first order, the photoconductive gain of a p-i-n photodiode for which $t_{eave} < t_{have}$ may be written as $$g = I_e/W_i + I_h/W_i, \text{ for } \tau_p \gg t_{have} - t_{eave} \qquad (4a)$$

$$g = I_e/W_i + I_h/W_i + (t_{have} - t_{eave})/(\tau_p + t_{tran,e}), \text{ for } \tau_p \lesssim t_{have} - t_{eave} \qquad (4b)$$

and for a photodiode with $t_{eave} > t_{have}$, $$g = I_e/W_i + I_h/W_i, \text{ for } \tau_n \gg t_{eave} - t_{have} \qquad (5a)$$

$$g = I_e/W_i + I_h/W_i + (t_{eave} - t_{have})/(\tau_n + t_{tran,h}), \text{ for } \tau_n \lesssim t_{eave} - t_{have} \qquad (5b)$$

where $I_e$ and $I_h$ are the distances in the intrinsic region of the photodiode travelled by the photogenerated electron and hole, $W_i$ is the width of the intrinsic region, and $t_{tran,e}$ and $t_{tran,h}$ are the transit times for an electron and hole to traverse the entire intrinsic region. These expressions are somewhat simplistic, based on mean times rather than on the probability distributions of those times. Nonetheless, they are useful for predicting general behavior, and have proved reasonably accurate in comparison with the few available experimental results to date (as shown in FIG. 2).

In bulk p-i-n photodetectors, $t_{eave}$ and $t_{have}$ are typically several orders of magnitude smaller than $\tau_p$, so that $\tau_p \gg t_{have} - t_{eave}$. Thus a typical bulk p-i-n photodetector with $t_{eave} < t_{have}$ will not exhibit photoconductive gain, because the p-region cannot provide excess minority electrons on the time scale required. Similarly, a typical bulk p-i-n photodetector with $t_{eave} > t_{have}$ will not exhibit photoconductive gain because the n-region cannot provide excess minority holes on the time scale required. Therefore, as expected, for typical bulk p-i-n photodetectors the traditional assumption of unity photoconductive gain, g=1, is valid. From equations (1) and (2), it may readily be seen that in order to obtain photoconductive gain in a photodiode, one must either delay the photogenerated carriers in the intrinsic region, so as to increase $|t_{have} - t_{eave}|$; or speed up the EHP generation in the p-region or n-region, so as to decrease $\tau_p$ or $\tau_n$; or both. These approaches are considered in the sections below.

Photogenerated Carrier Delay

Photogenerated carrier delay is the simplest means of attaining photoconductive gain in a photodiode, but has the disadvantage that photodiode bandwidth (speed) will be significantly compromised. By inserting delay structures in the intrinsic region, $|t_{have} - t_{eave}|$ may be dramatically increased, up to a theoretical limit of the carrier lifetime in the intrinsic region, $\tau_i$. The delay structures are designed to avoid severe trapping of both the photogenerated electron and hole, effectively decreasing the efficiency of EHP collection in the photodiode, reducing the gain of the photodiode. The preferred delay structures that are inserted or embedded in the p-n or p-i-n photodiode structures are those that preferentially delay either the electrons or the holes, so as to maximize $|t_{have}-t_{eave}|$. Non-limiting exemplary delay structures include, heterojunction barriers and wells, resonant tunneling barriers, and graded heterojunctions; the well known "staircase" graded heterojunction structures used in some avalanche photodiode designs are particularly preferred, as they can be used to impede one carrier type while allowing the other to be freely swept "down the staircase". The implementation of these and other delay structures will be known to those skilled in the art.

FIG. 2 shows the photoconductive gain measured for three InGaAs/InP multiple quantum well p-i-n diodes for various reverse biases. In order to obtain these photoconductive gains, the wavelength dependent responsivity of the diodes in the region of the absorption edge was first measured. The magnitude of the ground state excitonic absorption peaks were then compared with the predictions of a theoretical model that has been established as accurate using other experimental results (for example, only 3.9% deviation from the InGaAs/InP results reported in M. Sugawara, T. Fujii, S. Yamazaki, and K. Nakajima, "Optical characteristics of excitons in $In_{1-x}Ga_xAs_yP_{1-y}$/InP quantum wells", Phys. Rev. B, 44:1782–1791, 1991), but which assumes the devices to have no photoconductive gain. The results of this model were fit to the experimental results using photoconductive gain, g, as a fitting parameter to extract the gains.

In the devices studied, a simple multiple quantum well structure of 20 wells with 7.79 nm well widths and 15.04 nm barrier widths was sufficient to obtain modest photoconductive gains with doping levels in the InP p region of roughly $2.5 \times 10_{18}$ $cm^{-3}$. Established tunneling and thermionic emission models were used to calculate the delay effects of the multiple quantum well structure. Based on these calculations, and on the photoconductive gain theory proposed in brief above, the gains in the three devices were accounted for with reasonable accuracy, as shown by the theoretical curves in FIG. 2.

Increased EHP Generation Rate

The most attractive approach to attaining photoconductive gain in a photodiode is to increase the rate at which EHPs are generated in the p-region or n-region, so as to decrease $\tau_p$ or $\tau_n$. The benefits to this approach over the photogenerated carrier delay approach are that higher gains are possible (the delay approach is limited in that $|t_h-t_e|$ may not be increased beyond $\tau_i$) and that this approach does not compromise photodiode speed.

The simplest means of decreasing $\tau_p$ or $\tau_n$ is to include a region of "ultra-fast" high B-coefficient material in or near either the p-region or n-region, which has a much lower value of $\tau_p$ or $\tau_n$ for a given doping level. Typical B coefficient values for bulk InP is $3.3 \times 10^{-10}$ $cm^3s^{-1}$ (see R. K. Ahrenkiel, Minority-Carrier Lifetime in InP; pp. 77–79, Properties Of InP, Published by INSPEC, Institution Of Electrical Engineers, London, England, 1991). The helium plasma grown InGaAsP and low temperature grown AlGaAs material systems are excellent ultra-fast material prospects, each being demonstrated with recombination times on the order of a few ps or less. High B-coefficient material may also be engineered by incorporating heterojunction structures, such as multiple quantum well structures, within the material. Picken and David have proposed that the principle mechanism for carrier recombination in III-V quantum well structures is through nonradiative centers associated with the well-barrier interfaces, resulting in significantly higher recombination rates (W. Picken and J. P. R. David, "Carrier decay in GaAs quantum wells", AppI. Phys. Left., 56:268–270, 1990).

In another embodiment of the invention optical stimulation of a region in or near the p-region or n-region may be used to enhance the EHP generation rates, although care must be taken to ensure such optical stimulation does not interfere with the interpretation of optical signals input to the photodetector. For example, a light source may be mounted above the photodetector with the light focussed onto a region of the photodiode to provide a higher photogenerated hole-electron pair concentrations in that region.

Figure 3:
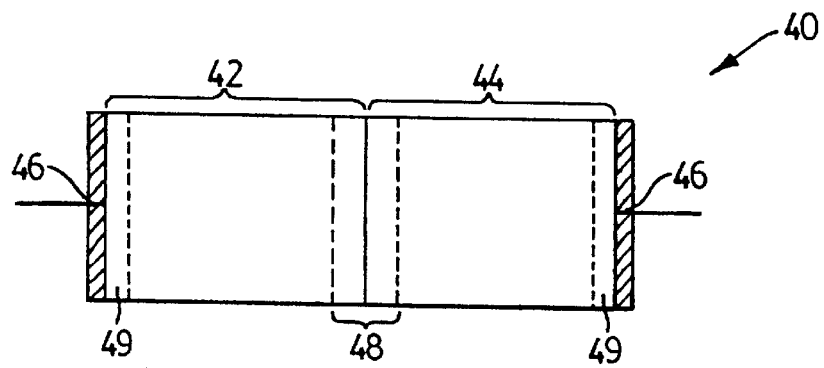
FIG. 3 shows a p-n photodiode produced in accordance with the present invention exhibiting photoconductive gain.
Figure 4:
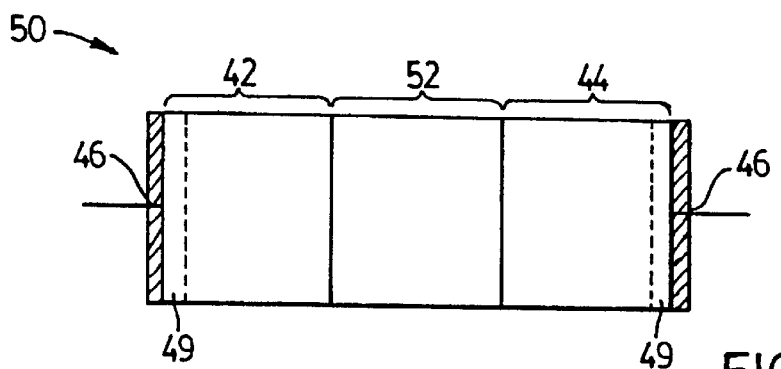
FIG. 4 shows a another embodiment of a photodiode according to the present invention designed to exhibit photoconductive gain.
Figure 5:
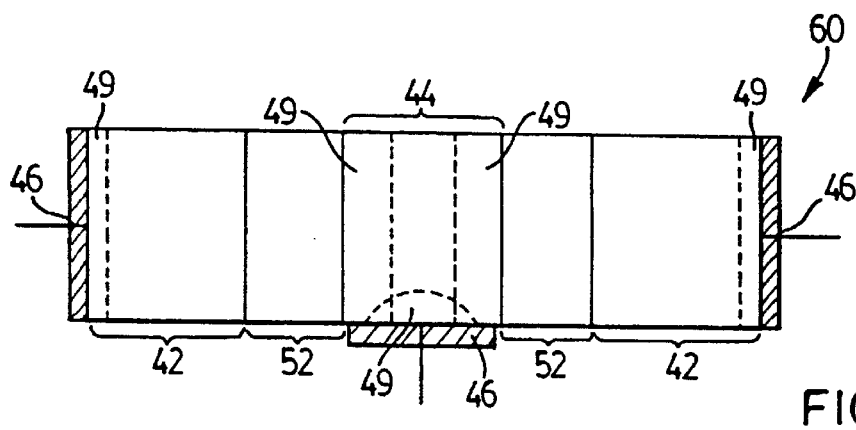
FIG. 5 shows an alternative embodiment of a photodiode exhibiting photoconductive gain.

Referring to FIGS. 3 to 5, different embodiments of photodiodes with photoconductive gain constructed in accordance with the present invention are shown. FIG. 3 shows a photodiode 40 comprising a p-type semiconductor material 42 and an n-type material 44 with electrical contacts 46 at each end of the photodiode. The depletion region 48 which forms naturally in the vicinity of the p-n junction will vary depending on the bias applied across the device. High EHP generation rate regions 49 may be embedded in the p-type material 42 and/or the n-type material 44 as shown, preferably near the electrical contacts 46. The extents of the high EHP generation rate regions 49 are depicted in FIG. 3 as being relatively small, but may be of various sizes, potentially including the entire n and p-type regions respectively. FIG. 3 shows a high EHP region in both p- and n-type regions but only one is required.

Referring to FIG. 4, a photodiode comprising a PIN photodiode structure is shown generally at 50. Photodiode 50 comprises a region of relatively intrinsic semiconductor material 52 sandwiched between p-type semiconductor material 42 and n-type material 44 with electrical contacts 46 at each end of the photodiode. High EHP generation rate regions may be placed in the p-type material 42 and/or the n-type material 44 as shown, preferably near the electrical contacts 46. The extents of the high EHP generation rate regions 49 are depicted in FIG. 4 as being relatively small, but may be of various sizes, potentially including the entire n and p-type regions respectively. FIG. 4 shows a high EHP generation rate region in both p- and n-type regions but only one is required.

FIG. 5 illustrates another embodiment of a photodiode device 60 exhibiting photoconductive gain. Photodiode 60 comprises a PINIP structure including two p-type regions 42 at the ends with an n-type region 44 in the middle and two intrinsic regions 52 sandwiched between the n-type region and in turn sandwiched between the p-type regions. The high EHP generation rate regions 49 may be located in the n-type region and/or p-type regions. FIG. 5 shows high EHP generation rate regions in a variety of locations but a single region or a combination of several regions may be used. The extents of the high EHP generation rate regions 49 are depicted in FIG. 5 as being relatively small, but may be of various sizes, potentially including the entire n and p-type regions respectively.

Combined Approach

In practice, the best design of a photodiode with photoconductive gain will likely combine the use of delay elements in the intrinsic (or depletion) region and enhanced EHP generation rates in the p- or n-regions of the photodiode. Given a certain bandwidth (speed) that the photodiode is required. to operate at, a delay element can be designed such that the slow carrier is collected just fast enough to meet the bandwidth specification. The p- or n-region of the photodiode can then be engineered to have a given effective $\tau_p$ or $\tau_n$, depending on the gain desired for the photodiode. This approach will allow the highest achievable photoconductive gains for a given bandwidth specification.

The basic principles of photoconductive gain in p-i-n photodiodes have been introduced, and techniques for designing practical photodiodes that make use of these gain effects have been described.

It will be understood by those skilled in the art that while the present invention has been illustrated with respect to simple photodiodes, more complex devices may be constructed that employ the same principles. The photodiodes shown in FIGS. 3 to 5 may be incorporate into standard photodetection circuits to produce photodetector devices with photoconductive gain.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

I claim:

1. a photodiode with photoconductive gain, comprising:
    a semiconductor including at least one p-type region, at least one n-type region, and electrical contacts attached to said n-type region and to said p-type region, whereby illuminating said semiconductor generates electron-hole pairs in at least one depletion region formed at a p-n junction; and
    means for enhancing an electron-hole pair generation rate in at least a portion of said semiconductor outside said at least one depletion region.

2. The photodiode device according to claim 1 wherein said means for enhancing an electron-hole pair generation rate comprises said at least a portion of said semiconductor including an effective semiconductor material having a minority carrier lifetime shorter than or on an order of a difference between the average times for an electron and a hole photogenerated within a specific depletion region to escape said specific depletion region.

3. The photodiode according to claim 2 wherein said effective semiconductor material is located within one of said p-type and n-type regions or both.

4. The photodiode device according to claim 2 wherein said effective semiconductor material includes material having a high B coefficient, wherein B is a characteristic coefficient for a given semiconductor material related to a thermal generation rate $g_i=Bn_i^2$, wherein $n_i$ is an intrinsic carrier concentration.

5. The photodiode device according to claim 2 wherein said effective semiconductor material includes material selected from the group consisting of low temperature grown AlGaAs/GaAs materials and helium plasma grown InGaAsP/InP materials.

6. The photodiode device according to claim 2 wherein said effective semiconductor includes a heterojunction structure having one or more abrupt heterojunctions or graded heterojunctions.

7. The photodiode device according to claim 1 wherein said means for enhancing an electron-hole pair generation rate in at least a portion of said semiconductor outside said at least one depletion region includes optical stimulation of said at least a portion of said semiconductor.

8. The photodiode device according to claim 2 including means for delaying transport of charge carriers located substantially in said depletion region, said charge carriers being selected from the group consisting of electrons and holes.

9. The photodiode device according to claim 8 wherein said means for delaying transport of charge carriers preferentially delays one of said charge carriers relative to the other.

10. The photodiode device according to claim 8 wherein said means for delaying transport of electrons or holes comprises at least one heterojunction structure.

11. The photodiode device device according to claim 10 wherein said heterojunction structure is selected from the group consisting of one or more abrupt heterojunctions, one or more graded heterojunctions and any combination of abrupt heterojunctions and graded heterojunctions.

12. The semiconductor device according to claim 10 wherein said heterojunction structures include quantum well structures.

13. A photodiode with photoconductive gain, comprising:
    a semiconductor including at least one p-type region, at least one n-type region, at least one intrinsic region, and electrical contacts attached to said n-type region and to said p-type region, whereby illuminating said semiconductor generates electron-hole pairs in at least one depletion region formed at a p-n junction and/or at an intrinsic region; and
    means for enhancing an electron-hole pair generation rate in at least a portion of said semiconductor outside said at least one depletion region.

14. The photodiode device according to claim 13 wherein said means for enhancing an electron-hole pair generation rate comprises said at least a portion of said semiconductor including an effective semiconductor material having a minority carrier lifetime shorter than or on an order of a difference between the average times for an electron and a hole photogenerated within a specific depletion region to escape said specific depletion region.

15. The photodiode according to claim 14 wherein said effective semiconductor material is located within one of said p-type and n-type regions or both.

16. The photodiode device according to claim 14 wherein said effective semiconductor material includes a material having a high B coefficient, wherein B is a characteristic coefficient for a given semiconductor material related to a thermal generation rate $g_i=Bn_i^2$, wherein $n_i$ is an intrinsic carrier concentration.

17. The photodiode device according to claim 14 wherein said effective semiconductor material includes material selected from the group consisting of low temperature grown AlGaAs/GaAs materials and helium plasma grown InGaAsP/InP materials.

18. The photodiode device according to claim 15 wherein said effective semiconductor material includes a heterojunction structure having one or more abrupt heterojunctions or graded heterojunctions.

19. The photodiode device according to claim 13 wherein said means for enhancing an electron-hole pair generation rate in at least a portion of said semiconductor outside said at least one depletion region includes optical stimulation of said at least a portion of said semiconductor.

20. The photodiode device according to claim 14 including means for delaying transport of charge carriers located substantially in said depletion region, said charge carriers being selected from the group consisting of electrons and holes.

21. The photodiode device according to claim 20 wherein said means for delaying transport of charge carriers preferentially delays one of said charge carriers relative to the other.

22. The photodiode device according to claim 20 wherein said means for delaying transport of electrons or holes comprises at least one heterojunction structure.

23. The photodiode device device according to claim 22 wherein said heterojunction structure is selected from the group consisting of one or more abrupt heterojunctions, one or more graded heterojunctions and any combination of abrupt heterojunctions and graded heterojunctions.

24. The semiconductor device according to claim 22 wherein said heterojunction structures include quantum well structures.

* * * * *

UNITED STATES PATENT AND TRADEMARK OFFICE
CERTIFICATE OF CORRECTION

PATENT NO. : 6,492,704 B1
DATED : December 10, 2002
INVENTOR(S) : Trenton G. Coroy It is certified that error appears in the above-identified patent and that said Letters Patent is hereby corrected as shown below:

Column 8,
Line 21, delete "p-n" and insert -- pin --.

Signed and Sealed this

Fifth Day of October, 2004

JON W. DUDAS
*Director of the United States Patent and Trademark Office*